(12) United States Patent
Liebau et al.

(10) Patent No.: US 8,969,170 B2
(45) Date of Patent: Mar. 3, 2015

(54) METHOD OF FORMING A SEMICONDUCTOR STRUCTURE INCLUDING A METAL-INSULATOR-METAL CAPACITOR

(71) Applicant: GLOBALFOUNDRIES Inc., Grand Cayman (KY)

(72) Inventors: Maik Liebau, Dresden (DE); Ronny Pfuetzner, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 191 days.

(21) Appl. No.: 13/827,786

(22) Filed: Mar. 14, 2013

(65) Prior Publication Data
US 2014/0273396 A1 Sep. 18, 2014

(51) Int. Cl.
*H01L 21/20* (2006.01)
*H01L 49/02* (2006.01)
(52) U.S. Cl.
CPC ..................................... *H01L 28/40* (2013.01)
USPC ......................................................... 438/399

(58) Field of Classification Search
USPC .......................................................... 438/399
See application file for complete search history.

(56) References Cited

U.S. PATENT DOCUMENTS

2008/0291601 A1* 11/2008 Roozeboom et al. ...... 361/306.2
2008/0291603 A1* 11/2008 Matters-Kammerer ...... 361/313
2010/0244189 A1* 9/2010 Klootwijk et al. ............ 257/532

* cited by examiner

*Primary Examiner* — Marvin Payen
(74) *Attorney, Agent, or Firm* — Amerson Law Firm, PLLC

(57) ABSTRACT

A method comprises forming a first layer of an electrically insulating material over a semiconductor structure. A recess is formed in the first layer of electrically insulating material. A capacitor layer stack is deposited over the first layer of electrically insulating material. The capacitor layer stack includes one or more bottom electrode layers, a dielectric layer and a top electrode layer, wherein a first portion of the capacitor layer stack is arranged in the recess and a second portion of the capacitor layer stack is arranged over a portion of the first layer of electrically insulating material adjacent the recess. A chemical mechanical polishing process is performed. The chemical mechanical polishing process removes the second portion of the capacitor layer stack, wherein the first portion of the capacitor layer stack is not removed.

20 Claims, 10 Drawing Sheets

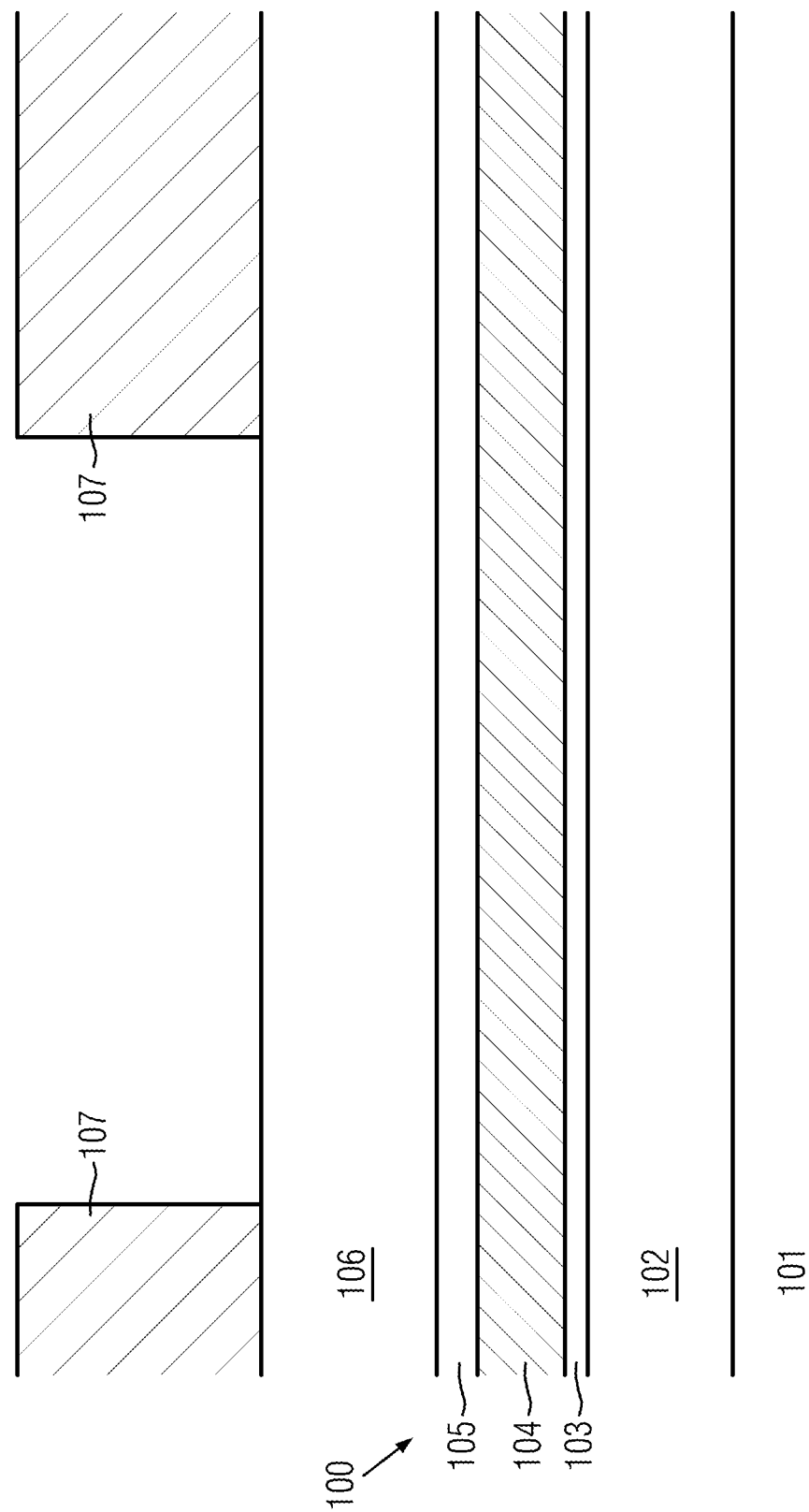

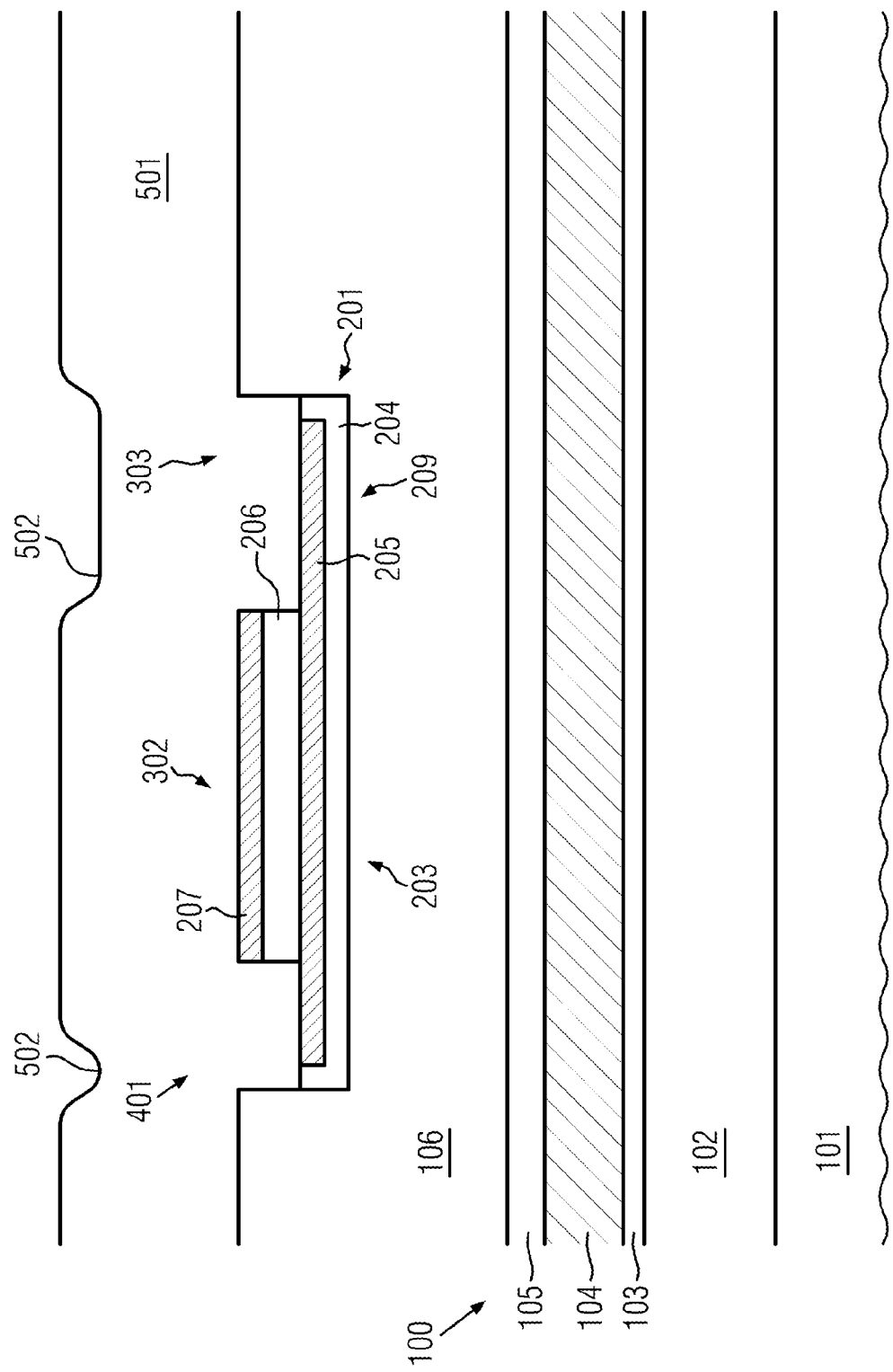

METHOD OF FORMING A SEMICONDUCTOR STRUCTURE INCLUDING A METAL-INSULATOR-METAL CAPACITOR

BACKGROUND OF THE INVENTION

1. Field of the Invention

Generally, the present disclosure relates to the field of integrated circuits, and, in particular, to integrated circuits including capacitors.

2. Description of the Related Art

Integrated circuits typically include a large number of circuit elements, which form an electric circuit. In addition to active devices such as, for example, field effect transistors and/or bipolar transistors, integrated circuits may include passive devices, such as resistors, inductors and/or capacitors.

Capacitors that may be provided in integrated circuits are described in "The International Technology Roadmap for Semiconductors," 2009 Edition, Interconnect. In addition to so-called native capacitors, which make use of the native or "parasitic" inter-metal capacity between metal lines in integrated circuits, there are metal-insulator-metal capacitors. Metal-insulator-metal capacitors may be provided in additional interconnect levels, which are provided in addition to interconnect levels, wherein electrically conductive lines connecting active circuit elements of integrated circuits, such as, for example, transistors, are provided.

Metal-insulator-metal capacitors may be used in CMOS, BICMOS and bipolar integrated circuits. Typical applications of metal-insulator-metal capacitors include filter and analog capacitors, for example, in analog-to-digital converters or digital-to-analog converters, decoupling capacitors, radio frequency coupling and radio frequency bypass capacitors in radio frequency oscillators, resonator circuits and matching networks. Key attributes of metal-insulator-metal capacitors may include a relatively high linearity over relatively broad voltage ranges, a relatively low series resistance, relatively good matching properties, relatively small temperature coefficients, relatively low leakage currents, a relatively high breakdown voltage and a sufficient dielectric reliability.

Techniques for forming metal-insulator-metal capacitors may include a deposition of a metal-insulator-metal stack on a planarized surface of a semiconductor structure and a patterning of the metal-insulator-metal stack. The metal-insulator-metal stack may include a bottom electrode layer, a dielectric layer and a top electrode layer. The metal-insulator-metal stack may be patterned by means of a photolithography process.

In the photolithography process, a mask formed of a photoresist may be employed. For forming the mask, photoresist is provided on the semiconductor structure having the metal-insulator-metal stack formed thereon. Thereafter, the semiconductor structure is aligned to the optical system of an exposure system. Then, a mask pattern is projected to the photoresist to expose portions of the photoresist, and the photoresist is processed by removing either the exposed portions of the photoresist or the non-exposed portions of the photoresist.

For aligning the semiconductor structure to the optical system of the exposure system, optical alignment techniques employing alignment marks provided in the semiconductor structure may be employed.

An issue that can occur in the above-described method of forming a metal-insulator-metal capacitor is a relatively low intensity of optical signals from alignment marks provided in the semiconductor structure below the metal-insulator-metal stack, which may be caused by absorption and/or reflection of light by the metal-insulator-metal stack. Therefore, optical alignment of a photomask used in the photolithography process for patterning the metal-insulator-metal stack may be difficult or, for some materials used for forming the metal-insulator-metal stack, substantially impossible.

The absorption and/or reflection of light by the metal-insulator-metal stack is largely depending on the materials used and the thicknesses of the layers in the metal-insulator-metal stack. Thus, there are limited material combinations that enable optical alignment through the metal-insulator-metal stack.

It has been proposed to circumvent the alignment problem by performing additional photolithography steps. A so-called "clear out-litho" process uses a pre-lithography step to pattern windows in the metal-insulator-metal stack above alignment marks on the semiconductor structure. The cleared alignment marks are then used for aligning the photomask when the metal-insulator-metal capacitors are formed. Further techniques for forming metal-insulator-metal capacitors include forming a particular topography of the surface of the semiconductor structure before the deposition of the metal-insulator-metal stack, and using the topography for alignment of the photomask.

However, these techniques for avoiding issues related to the alignment of photomasks by means of alignment marks in the formation of metal-insulator-metal capacitors may require additional photolithography steps, in addition to those used for patterning the metal-insulator-metal stack. Thus, a complexity of the manufacturing process and the costs of the manufacturing process are increased.

The present disclosure provides manufacturing processes wherein the above-mentioned issues may be avoided or at least reduced.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes forming a first layer of an electrically insulating material over a semiconductor structure. A recess is formed in the first layer of electrically insulating material. A capacitor layer stack is deposited over the first layer of electrically insulating material. The capacitor layer stack includes one or more bottom electrode layers, a dielectric layer and a top electrode layer. A first portion of the capacitor layer stack is arranged in the recess. A second portion of the capacitor layer stack is arranged over a portion of the first layer of electrically insulating material adjacent the recess. A chemical mechanical polishing process is performed. The chemical mechanical polishing process removes the second portion of the capacitor layer stack. At least a substantial part of the first portion of the capacitor layer stack is not removed.

Another illustrative method disclosed herein includes forming a layer of an electrically insulating material over a semiconductor structure. The semiconductor structure includes an electrically conductive line including a metal. A recess is formed in the layer of electrically insulating material. A capacitor layer stack is deposited over the layer of electrically insulating material. The capacitor layer stack includes one or more bottom electrode layers including at least one of a metal and a metal compound, a dielectric layer and a top electrode layer including at least one of a metal and a metal compound. The capacitor layer stack has a thickness corresponding to a depth of the recess. A chemical mechanical polishing process is performed. The chemical mechanical polishing process removes a first portion of the capacitor layer stack over a portion of the layer of electrically insulating material adjacent the recess. At least a substantial part of a second portion of the capacitor layer stack in the recess is not removed. After the chemical mechanical polishing process, a photolithography process patterning the second portion of the capacitor layer stack is performed.

BRIEF DESCRIPTION OF THE DRAWINGS

The disclosure may be understood by reference to the following description taken in conjunction with the accompanying drawings, in which like reference numerals identify like elements, and in which:

FIGS. 1a and 1b show schematic views of a semiconductor structure in a stage of a manufacturing process according to an embodiment, wherein FIG. 1a shows a schematic cross-sectional view and FIG. 1b shows a schematic top view;

FIGS. 4a and 4b show schematic views of the semiconductor structure in another stage of the manufacturing process, wherein FIG. 4a shows a schematic cross-sectional view and FIG. 4b shows a schematic top view;

FIG. 5 shows a schematic cross-sectional view of the semiconductor structure in another stage of the manufacturing process;

Figure 1B:
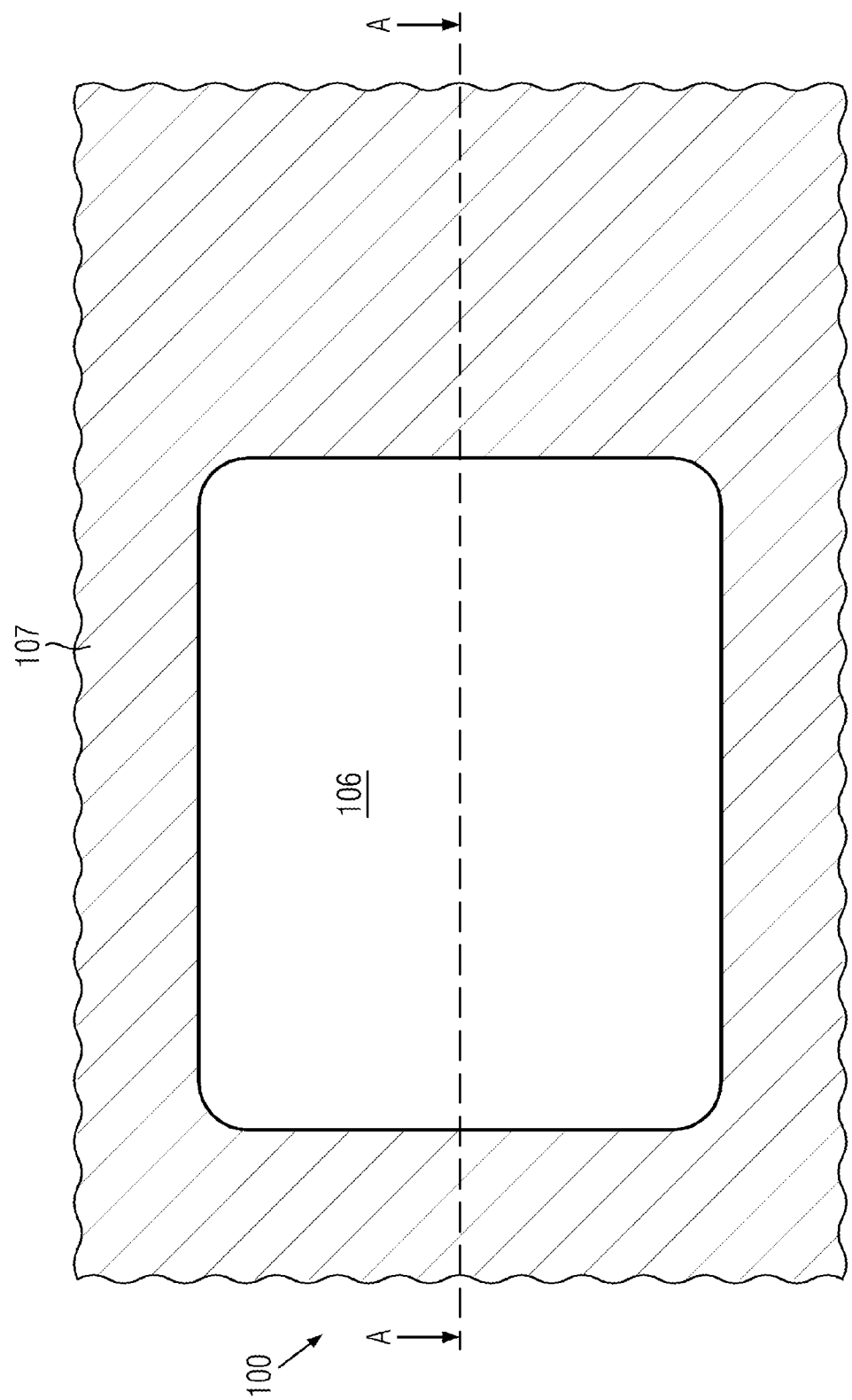

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides a self-aligned process that may be employed for the formation of metal-insulator-metal capacitors, and that is based on a chemical mechanical polishing of the metal-insulator-metal stack. More specifically, the formation of the metal-insulator-metal capacitor may include patterning a profile into a layer of electrically insulating material. The layer of electrically insulating material may be a silicon dioxide layer formed by means of a chemical vapor deposition process or plasma enhanced chemical vapor deposition process wherein tetraethyl orthosilicate (TEOS) is used as a reactant. A metal-insulator-metal stack may be deposited on the patterned layer of electrically insulating material. The profile may have a step height corresponding to the height of the metal-insulator-metal stack. A chemical mechanical polishing process may be performed for removing the layers of the metal-insulator-metal stack of the embossed regions of the layer of electrically insulating material to make alignment patterns below the metal-insulator-metal stack visible. The so-formed structure may be further processed by opening the bottom metal electrode, contact etch and further standard copper damascene technology.

FIGS. 1a and 1b show schematic views of a semiconductor structure 100 in a stage of a method according to the present disclosure. FIG. 1b shows a schematic top view of the semiconductor structure 100, and FIG. 1a shows a schematic cross-sectional view along the line A-A shown in FIG. 1b.

The semiconductor structure 100 may include a substrate 101. In some embodiments, the substrate 101 may include a bulk semiconductor substrate formed of a semiconductor material, for example a silicon wafer or silicon die. In other embodiments, the substrate 101 may include a semiconductor-on-insulator (SOI) substrate including a layer of a semiconductor material, for example a silicon layer, that is formed above a support substrate, which may be a silicon wafer, and is separated therefrom by a layer of an electrically insulating material, for example a silicon dioxide layer.

The semiconductor structure 100 may further include an interlayer dielectric 102. The interlayer dielectric 102 may include an electrically insulating material, for example silicon dioxide and/or silicon nitride. Additionally and/or alternatively, the interlayer dielectric 102 may include a low-k dielectric material having a dielectric constant smaller than the dielectric constant of silicon dioxide, for example fluorine-doped silicon dioxide, carbon-doped silicon dioxide, porous silicon dioxide, porous carbon-doped silicon dioxide, a polymeric dielectric such as polyimide, polynorbornenes, benzocyclobutene and/or polytetrafluoroethylene, or a silicon-based polymeric dielectric, for example hydrogen silsesquioxane and/or methylsilsesquioxane.

In some embodiments, a circuit (not shown) may be provided in, on and/or above the substrate 101. The circuit may include a plurality of circuit elements, in particular field effect transistors. Each of the field effect transistors may have an active region including a source region, a drain region and a channel region that is formed in the semiconductor material of the substrate 101. Additionally, each of the field effect transistors may include a gate electrode formed above the channel region of the respective transistor and below the interlayer dielectric 102, as well as a gate insulation layer provided between the gate electrode and the channel region. The gate insulation layer may provide electrical insulation between the gate electrode and the channel region. Further features of the field effect transistors may correspond to features of known field effect transistors.

The semiconductor structure 100 may further include an electrically conductive line 104. The electrically conductive line 104 may include a metal, for example copper and/or a copper alloy. A diffusion barrier layer 103 may be provided between the electrically conductive line 104 and the interlayer dielectric 102. The diffusion barrier layer 103 may be adapted for substantially avoiding a diffusion of metal from the electrically conductive line 104 into the interlayer dielectric 102. In some embodiments, the diffusion barrier layer 103 may include one or more layers including titanium nitride (TiN), tantalum (Ta) and/or tantalum nitride (TaN).

Above the electrically conductive line 104, an etch stop layer 105 may be provided. The etch stop layer 105 may include a dielectric material such as, for example, silicon nitride, which may also have diffusion barrier properties for the metal of the electrically conductive line 104.

In some embodiments, the semiconductor structure 100 may further include one or more contact vias (not shown) filled with an electrically conductive material, for example copper, a copper alloy and/or tungsten, providing an electrical connection between the electrically conductive line 104 and other portions of the semiconductor structure 100, for example circuit elements, such as field effect transistors and/or electrically conductive lines other than the electrically conductive line 104.

The above-described features of the semiconductor structure 100 may be formed as follows. The substrate 101 may be provided, and a plurality of circuit elements, such as field effect transistors, may be formed in, on and/or above the substrate 101 by means of known semiconductor processing techniques. Thereafter, the interlayer dielectric 102 may be deposited. This may be done by means of techniques such as chemical vapor deposition, plasma enhanced chemical vapor deposition and/or spin coating. In some embodiments, a planarization process, for example a chemical mechanical polishing process, may be performed after the deposition of the interlayer dielectric 102 for obtaining a substantially planar surface of the interlayer dielectric. In other embodiments, in particular in embodiments wherein the interlayer dielectric 102 is deposited by means of spin coating, the planarization process may be omitted, since spin coating can yield substantially planar surfaces of the deposited interlayer dielectric.

After the deposition of the interlayer dielectric 102, the electrically conductive line 104 may be formed. The formation of the electrically conductive line 104 may include forming a trench and, optionally, one or more contact vias in the interlayer dielectric 102. This may be done by means of techniques of photolithography and/or etching. Thereafter, the diffusion barrier layer 103 may be deposited by means of one or more processes of chemical vapor deposition, plasma enhanced chemical vapor deposition and/or sputtering. Then, the trench may be filled with the electrically conductive material of the layer 104. In embodiments wherein the electrically conductive line 104 includes copper and/or a copper alloy, this may be done by means of electroplating.

Thereafter, a chemical mechanical polishing process may be performed for removing portions of the material of the electrically conductive line 104 and/or the diffusion barrier layer 103 outside the trench. The electrically conductive material deposited in the trench remains in the semiconductor structure 100 and forms the electrically conductive line 104. Thereafter, the etch stop layer 105 may be deposited, for example, by means of chemical vapor deposition and/or plasma enhanced chemical vapor deposition.

Further features of the formation of the electrically conductive line 104 and/or one or more contact vias filled with electrically conductive material may correspond to those of known damascene or dual-damascene processes for forming interconnects in a semiconductor structure.

The present disclosure is not limited to embodiments wherein the semiconductor structure 100 includes a single interlayer dielectric layer 102 wherein an electrically conductive line 104 is formed. In other embodiments, the semiconductor structure 100 may include a plurality of interlayer dielectric layers similar to interlayer dielectric layer 102, wherein each of the interlayer dielectric layers includes one or more electrically conductive lines similar to electrically conductive line 104, and wherein the interlayer dielectric layers 102 are stacked on top of each other. Contact vias filled with electrically conductive material, for example a metal such as copper and/or a copper alloy, may be provided for providing electrical connection between electrically conductive lines in different layers.

A layer 106 of an electrically insulating material is deposited over the semiconductor structure 100. The material of the layer 106 of electrically insulating material may be selectively etchable with respect to the material of the etch stop layer 105.

In selective etching of a first material relative to a second material, an etch process is employed wherein an etch rate of the first material is substantially greater than an etch rate of the second material. The etch rate of a material may be expressed in terms of a thickness of a portion of a layer of the material that is removed per unit time when the material is exposed to an etchant used in the etch process, wherein the thickness is measured in a direction perpendicular to the surface of the layer of material.

In some embodiments, the etch stop layer 105 may include silicon nitride and the layer 106 of electrically insulating material may include silicon dioxide. Selective etching of silicon dioxide with respect to silicon nitride may be performed by means of a dry etch process wherein an etch gas containing carbon tetrafluoride ($CF_4$), a mixture of carbon tetrafluoride ($CF_4$) and oxygen ($O_2$) and/or a mixture of carbon tetrafluoride ($CF_4$) and hydrogen ($H_2$) is employed.

The layer 106 of electrically insulating material, when including silicon dioxide, may be formed by means of a chemical vapor deposition process or plasma enhanced chemical vapor deposition process wherein a reactant gas including tetraethyl orthosilicate (TEOS) is employed.

After the formation of the layer 106 of electrically insulating material, a recess 201 (see FIG. 2) may be formed in the layer 106 of electrically insulating material.

The recess 201 may be formed by means of a photolithography process. In the photolithography process, a mask 107 may be formed on the layer 106 of electrically insulating material. The mask 107 covers portions of the layer 106 of electrically insulating material other than those where the recess 201 is to be formed. The mask 107 may include a photoresist and may be formed by exposing a layer of photoresist with a light pattern that may be obtained by projecting a reticle on the semiconductor structure 100, and developing the photoresist. When the photoresist is developed, exposed or, alternatively, unexposed portions of the photoresist are selectively removed by a developer solution.

Figure 2:
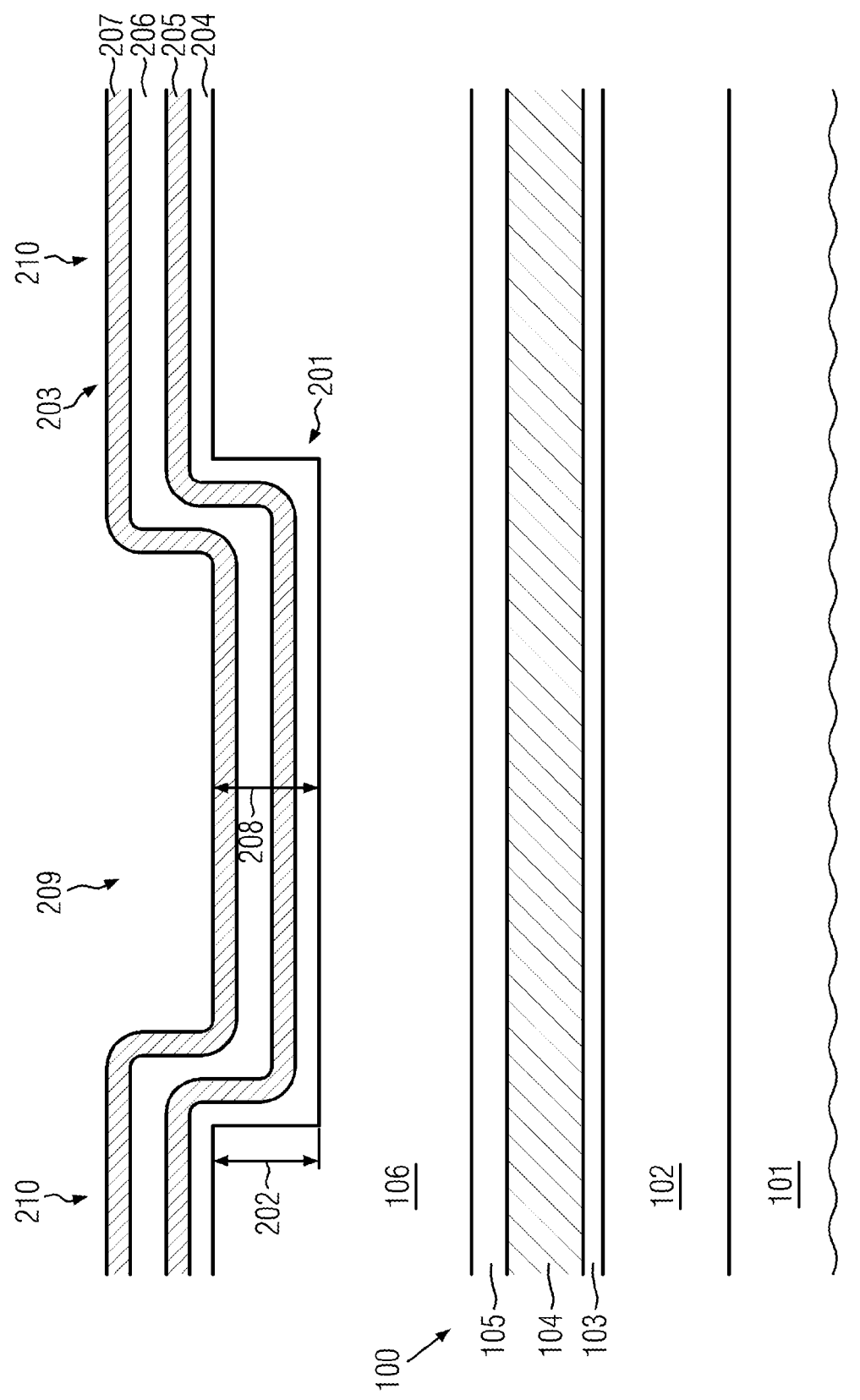
FIG. 2 shows a schematic cross-sectional view of the semiconductor structure in another stage of the manufacturing process.

FIG. 2 shows a schematic cross-sectional view of the semiconductor structure 100 in a later stage of the manufacturing process. After the formation of the mask 107, an etch process may be performed. The etch process may be an anisotropic etch process, wherein an etch rate at which a portion of the material of the layer 106 of electrically insulating material is removed depends on the orientation of the surface of the portion of the layer 106 of electrically insulating material relative to a vertical direction.

The vertical direction may be parallel to a thickness direction of the substrate 101, wherein an extension of the substrate 101 in the thickness direction is smaller than an extension of the substrate 101 in any horizontal direction that is perpendicular to the thickness direction. In particular, the thickness direction may be parallel to a normal direction of a surface of the substrate 101 on which circuit elements such as field effect transistors are formed.

In the anisotropic etch process, the etch rate of portions of the layer 106 of electrically insulating material having a substantially horizontal surface that is perpendicular to the thickness direction is greater than an etch rate of portions of the layer 106 of electrically insulating material having a surface that is oblique or parallel to the horizontal direction.

Due to the anisotropy of the etch process, the recess 201 may obtain a substantially horizontal bottom surface and substantially vertical sidewalls, as schematically shown in FIG. 2.

The etch process may be stopped before the portion of the layer 106 of electrically insulating material that is not covered by the mask 107 is completely removed. Thus, a portion of the material of the layer 106 of electrically insulating material remains at the bottom of the recess 201. In FIG. 2, reference numeral 202 denotes a depth of the recess 201, being a distance between the bottom surface of the recess 201 and the surface of portions of the layer 106 of electrically insulating material adjacent the recess 201, the distance being measured along the vertical direction. As shown in FIG. 2, the depth 202 of the recess 201 may be smaller than a thickness of the layer 106 of electrically insulating material.

In some embodiments, the layer 106 of electrically insulating material may have a thickness of about 200 nm, and the depth 202 of the recess 201 may be about 182 nm. The etch stop layer 105 below the layer 106 of electrically insulating material may have a thickness of about 60 nm.

The present disclosure, however, is not limited to the particular numerical values of the thicknesses of the layers 105, 106, and the depth 202 of the recess 201 mentioned above. In other embodiments, different values may be employed. For example, the etch stop layer 105 may have a thickness in a range from about 10-100 nm, the layer 106 of electrically insulating material may have a thickness of less than about 15000 nm and the depth 202 of the recess 201 may have a value in a range from about 50-500 nm.

The etch process used for the formation of the recess 201 may be a plasma etch process adapted to selectively remove the material of the layer 106 of electrically insulating material. In embodiments wherein the layer 106 of electrically insulating material includes silicon dioxide, the etch process may be a plasma etch process wherein an etch gas containing carbon tetrafluoride, a mixture of carbon tetrafluoride and oxygen, and/or a mixture of carbon tetrafluoride and hydrogen is employed. The degree of anisotropy of the etch process may be controlled by adjusting parameters of the plasma etch process, such as a bias voltage applied to the semiconductor structure 100, a radio frequency power applied to the etch gas for creating the plasma, as well as composition and pressure of the etch gas.

After the formation of the recess 201, the mask 107 may be removed. This may be done by means of a resist strip process, for example a plasma resist strip process, wherein a plasma is created by a radio frequency discharge in a gas including oxygen.

After the removal of the mask 107, a capacitor layer stack 203 may be deposited. The capacitor layer stack 203 may include bottom electrode layers 204, 205, wherein the bottom electrode layers 204, 205 may be formed of different materials. The bottom electrode layer 204 may be deposited directly on the layer 106 of electrically conductive material, and the bottom electric layer 205 may be deposited over the bottom electrode layer 204.

The bottom electrode layer 204 may include a metal, for example aluminum. The bottom electrode layer 204 may be deposited by means of a physical vapor deposition process, for example a sputtering process. The bottom electrode layer 104 may have a thickness in a range from about 50-1000 nm, in particular a thickness of about 80 nm.

The bottom electrode layer 205 may include a metal compound, for example titanium nitride, and may be deposited by means of a physical vapor deposition process, for example sputtering, a chemical vapor deposition process or a plasma enhanced chemical vapor deposition process. The bottom electrode layer 205 may have a thickness in a range from about 10-250 nm, in particular a thickness of about 35 nm.

The capacitor layer stack 203 may further include a dielectric layer 206. The dielectric layer 206 includes a material that is electrically insulating. In some embodiments, the dielectric layer 206 may include a high-k material having a greater dielectric constant than silicon dioxide. In some embodiments, the dielectric layer 206 may include tantalum pentoxide ($Ta_2O_5$). The dielectric layer 205 may be deposited by means of a chemical vapor deposition process or an atomic layer deposition process. In some embodiments, after the formation of the dielectric layer 206, the dielectric layer 206 may be annealed in an ambient including ozone. The ozone may be created by irradiating a gas including oxygen with ultraviolet radiation. The annealing process may help to provide a further reduction of the electrical conductivity of the dielectric layer 206. In further embodiments, the dielectric layer 206 may be deposited in a number of steps, wherein, in each step, a portion of the dielectric layer 206 is deposited, and an annealing process in an ambient including ozone is performed after each deposition step. The dielectric layer 206 may have a thickness of less than about 200 nm, in particular a thickness of about 12 nm.

The capacitor layer stack 203 further includes a top electrode layer 207 that is formed on the dielectric layer 206. The top electrode layer 207 may include a metal or a metal compound, for example titanium nitride. For forming the top electrode layer 207, deposition processes corresponding to those used for the formation of the bottom electrode layer 205 may be employed, as described above. The top electrode layer 207 may have a thickness in a range from about 10-250 nm, in particular a thickness of about 55 nm.

The present disclosure is not limited to embodiments wherein the capacitor layer stack 203 has a configuration as described above. For example, in other embodiments, the capacitor layer stack 203 may include a single bottom electrode layer including a metal such as, for example, aluminum or a metal compound such as, for example, titanium nitride. The top electrode layer 207 may be formed of the same material as the bottom electrode layer, or from a different material.

Moreover, the dielectric layer 206 may be formed from a dielectric material other than tantalum pentoxide, for example a material selected from a group of materials including silicon dioxide, silicon oxynitride, silicon nitride, aluminum oxide ($Al_2O_3$), hafnium oxide ($HfO_2$), niobium oxide ($Nb_2O_5$), titanium tantalum oxide (TiTaO), barium strontium titanate (BST) and strontium titanate (STO). In some embodiments, the dielectric layer 206 may include a dielectric stack including sub-layers formed of different materials selected from the above-mentioned group of materials. The bottom electrode layers 204, 205 and the top electrode layer 207 may be formed of materials other than aluminum and titanium nitride, for example copper or tantalum nitride.

In FIG. 2, reference numeral 208 denotes a thickness of the capacitor layer stack 203, measured along the vertical direction. The thickness 208 of the capacitor layer stack 203 may correspond to the depth 202 of the recess 201 in the layer 106 of electrically insulating material. In particular, the thickness 208 of the capacitor layer stack 203 and the depth 202 of the recess 201 may be approximately equal. Thus, a portion 209 of the capacitor layer stack 203 in the recess 201 has a surface lying in a substantially same plane as an interface between the layer 106 of electrically insulating material and a portion 210 of the capacitor layer stack 203 that is arranged over a portion of the layer 106 of electrically insulating material adjacent the recess 201. The portion 210 of the capacitor layer stack 203 that is arranged over a portion of the layer 106 of electrically insulating material adjacent the recess 201 is horizontally spaced apart from the portion 209 of the capacitor layer stack in the recess 201, wherein any horizontal direction is substantially perpendicular to the vertical direction corresponding to the thickness direction of the substrate 101.

Figure 3:
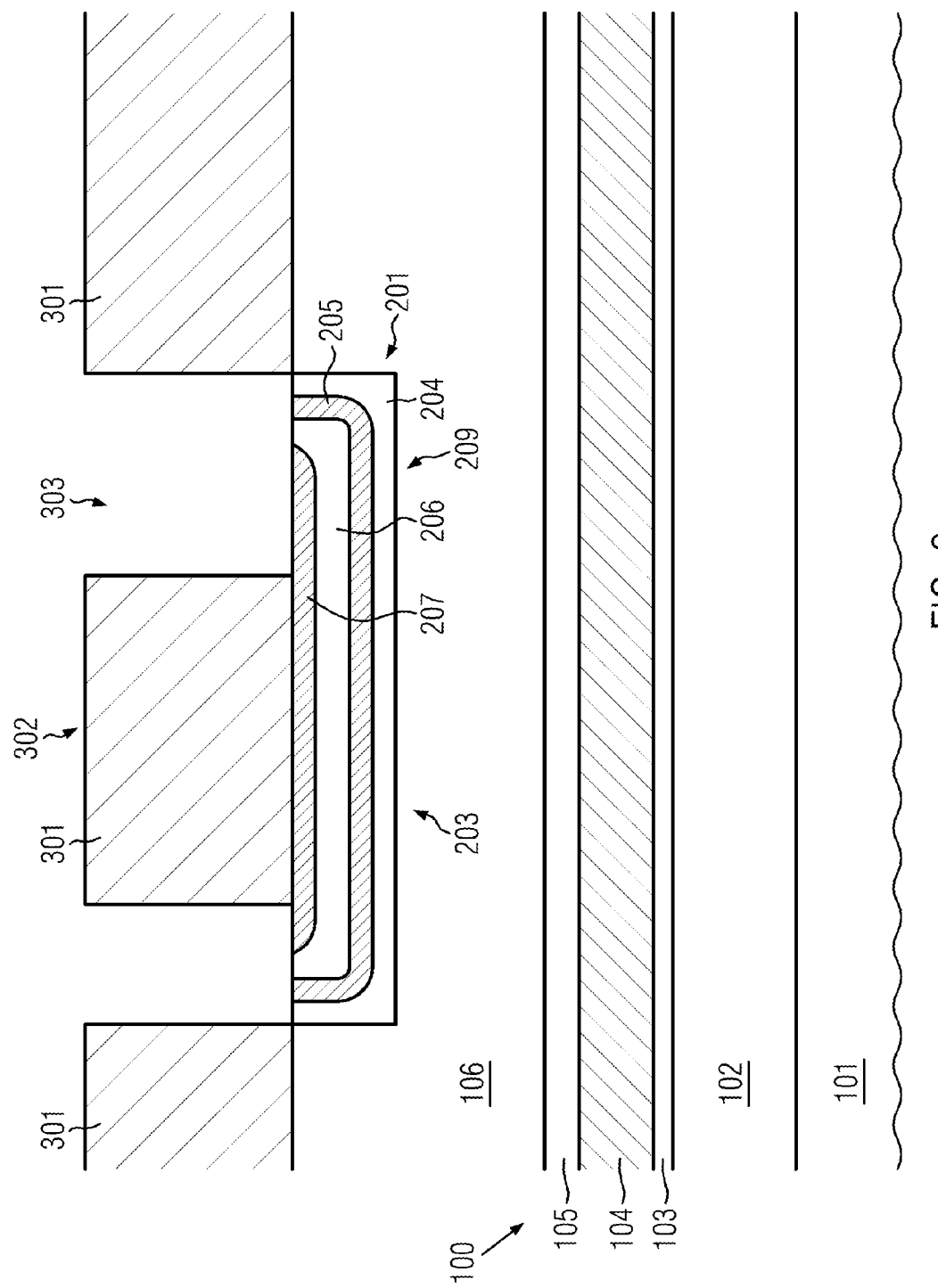
FIG. 3 shows a schematic cross-sectional view of the semiconductor structure in another stage of the manufacturing process.

FIG. 3 shows a schematic cross-sectional view of the semiconductor structure 100 in a later stage of the manufacturing process. After the deposition of the capacitor layer stack 203, a chemical mechanical polishing process may be performed. In the chemical mechanical polishing process, the surface of the semiconductor structure 100 on which the capacitor layer stack 203 has been deposited (on top in the view of FIG. 3) is moved relative to a polishing pad while a slurry is supplied to an interface between the surface of the semiconductor structure 100 and the polishing pad. The slurry may react chemically with portions of the semiconductor structure 100 at the surface, and reaction products may be removed by friction between the semiconductor structure 100 and the polishing pad and/or by abrasion caused by abrasive particles in the slurry.

In the chemical mechanical polishing process, the semiconductor structure 100 may be planarized, so that after the chemical mechanical polishing process, the semiconductor structure 100 has a substantially planar, horizontal surface being substantially perpendicular to the above-mentioned vertical direction that is parallel to the thickness direction of the substrate 101.

In the chemical mechanical polishing process, the portion 210 of the capacitor layer stack 203 that is arranged over a portion of the layer 106 of electrically insulating material adjacent the recess 201 may be removed. Thus, after the chemical mechanical polishing process, the portion of the layer 106 of electrically insulating material adjacent the recess 201 is exposed at the surface of the semiconductor structure 100.

The chemical mechanical polishing process may be stopped as soon as the portion 210 of the capacitor layer stack 203 is removed, so that the exposed surface of the portion of the layer 106 of electrically insulating material adjacent the recess 201 substantially corresponds to the surface of the portion of the layer 106 of electrically insulating material adjacent the recess 201 before the deposition of the capacitor layer stack 203, and the portion 209 of the capacitor layer stack 203 is not removed in the chemical mechanical polishing process.

In some embodiments, however, the chemical mechanical polishing process may remove a small amount of the material of the layer 106 of electrically insulating material adjacent the recess 201. Moreover, the chemical mechanical polishing process may remove a small amount of the material of the top electrode layer 207 in the recess 201, wherein, however, a substantial part of the portion of the top electrode layer 207 in the recess 201 is not removed, so that the integrity of the portion 209 of the capacitor layer stack 203 in the recess 201 is not affected. In some embodiments, at least 80%, at least 90% and/or at least 95% of the thickness of the portion of the top electrode layer 207 in the recess 201 may remain in the semiconductor structure 100 after the chemical mechanical polishing process.

After the chemical mechanical polishing process, a photolithography process may be performed. The photolithography process may pattern the portion 209 of the capacitor layer stack 203 in the recess 201.

In the photolithography process, a capacitor 401 (see FIGS. 4a and 4b) may be formed from the portion 209 of the capacitor layer stack 203 in the recess 201, as will be detailed in the following.

A mask 301 may be formed over the semiconductor structure 100. The mask 301 may be formed of a photoresist by means of techniques of photolithography. The mask 301 may cover portions of the layer 106 of electrically insulating material adjacent the recess 201. Additionally, the mask 301 may cover a part of the portion 209 of the capacitor layer stack 203 from which a capacitive area 302 of the capacitor 401 is formed. Adjacent the capacitive area 302, there may be a bottom electrode contact area 303 of the capacitor 401 that is not covered by the mask 301.

The bottom electrode contact area may include a region wherein a bottom electrode contact via 601 (see FIG. 6) providing an electric contact to the bottom electrode layers 204, 205 will be formed (on the right side of the capacitive area 302 in FIG. 3), and a more narrow portion (which, in some embodiments, may have a width of about 315 nm) that annularly encloses the capacitive area 302. In particular, the bottom electrode contact area 303 may include parts of the portion 209 of the capacitor layer stack 203 in the recess 201 in the vicinity of the edges of the recess 201, where the bottom electrode layers 204, 205 and the dielectric layer 206 are not parallel to the bottom surface of the recess 201, but extend substantially parallel to the sidewalls of the recess 201.

Figure 4A:
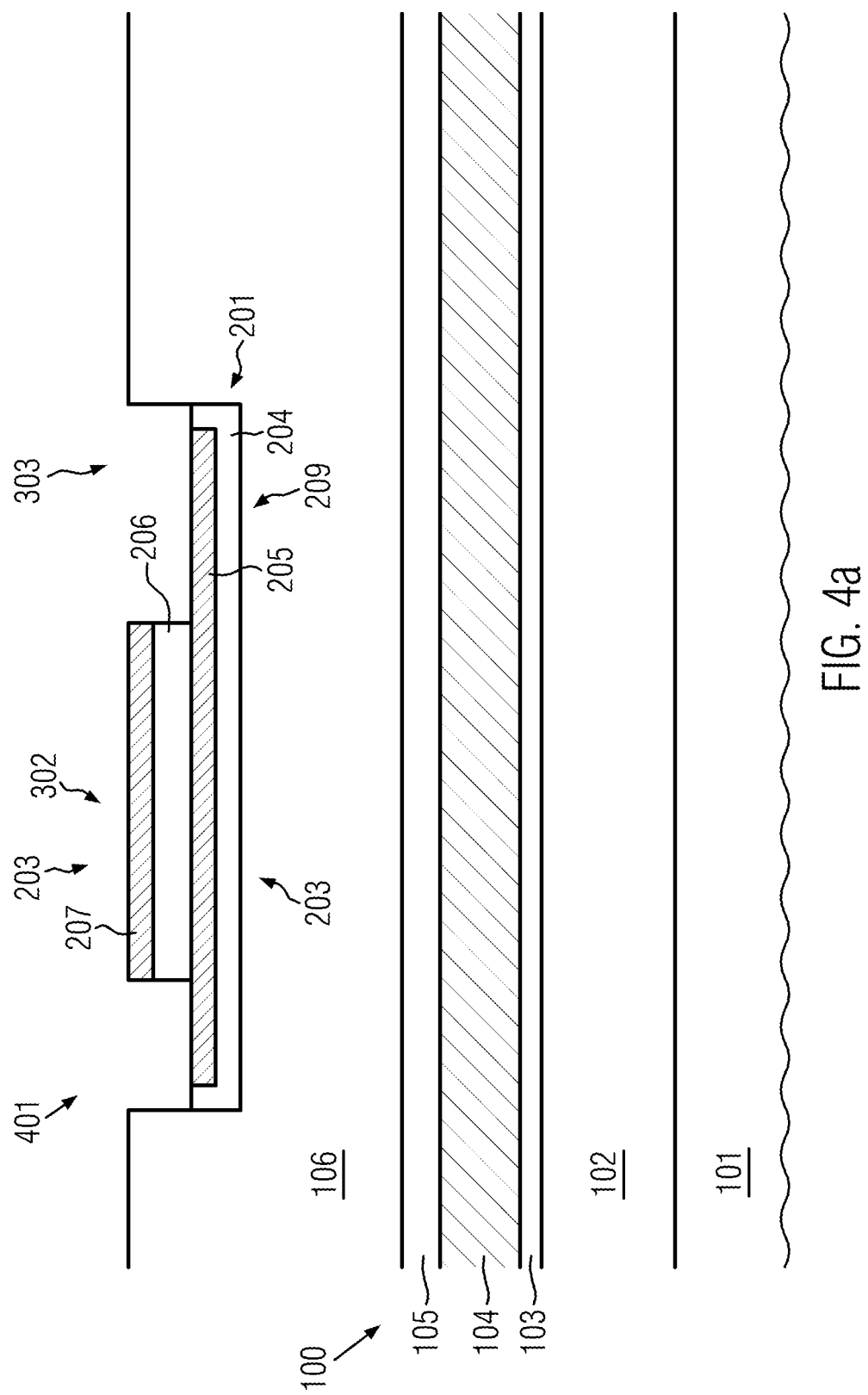
Figure 4B:
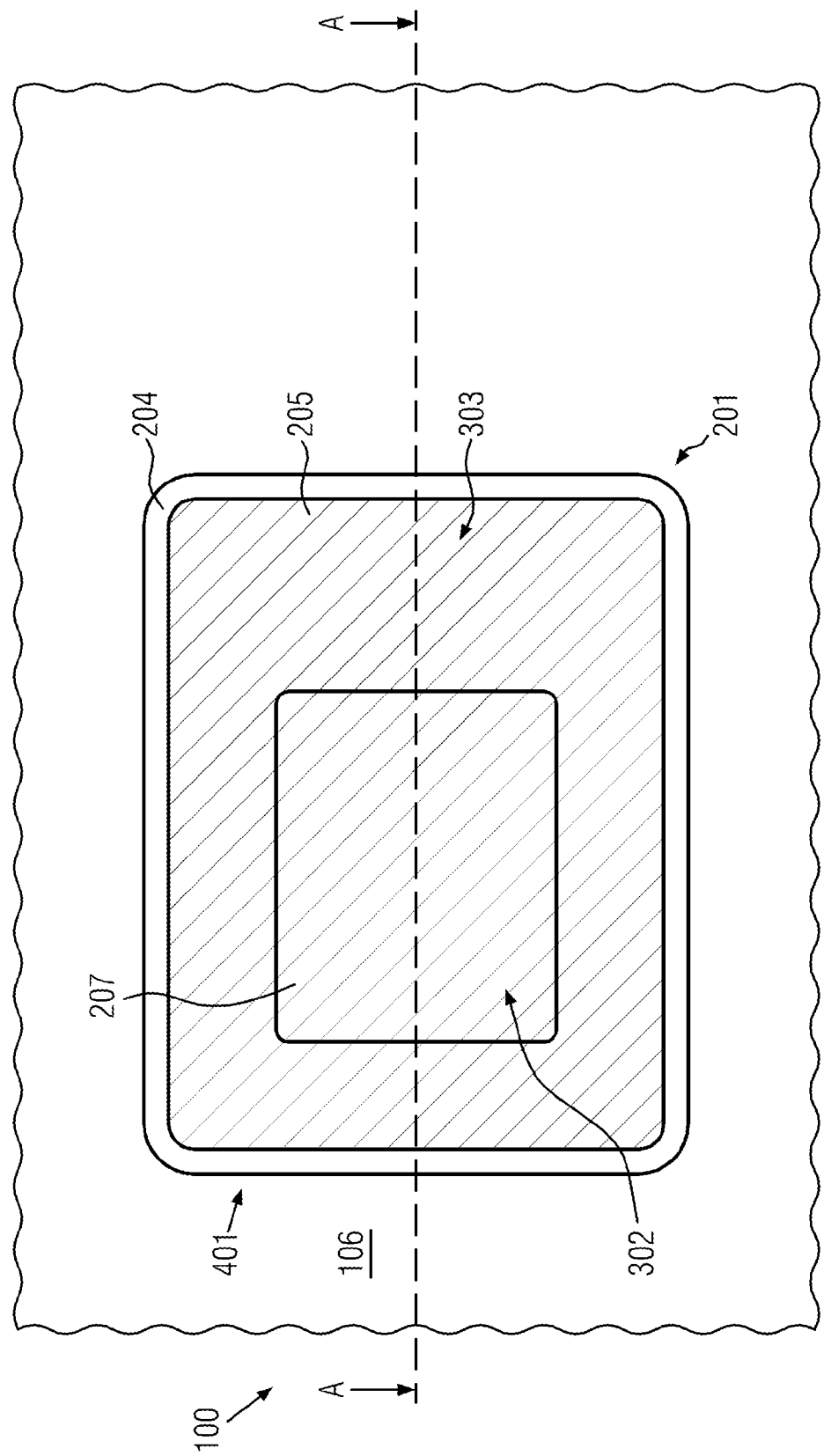

FIGS. 4a, 4b show schematic views of the semiconductor structure 100 in a later stage of the manufacturing process, wherein FIG. 4b shows a schematic top view and FIG. 4a shows a schematic cross-sectional view along the line A-A, corresponding to the schematic cross-sectional views shown in FIGS. 1a, 2 and 3.

After the formation of the mask 301, an etch process removing portions of the top electrode layer 207 and the dielectric layer 206 in the bottom electrode contact area 303 may be performed. Portions of the top electrode layer 207 and the dielectric layer 206 in the capacitive area 302 are protected from being exposed to an etchant used in the etch process by the mask 301, so that they are not removed in the etch process. Moreover, the mask 301 may protect portions of the layer 106 of electrically insulating material adjacent the recess 201 from being affected by the etchant.

The etch process used for removing portions of the top electrode layer 207 and the dielectric layer 206 in the bottom electrode contact area 303 may be a plasma etch process wherein a source gas including fluorine and a fluorocarbon is employed, in particular in embodiments wherein the top electrode layer 207 includes titanium nitride and the dielectric layer 206 includes tantalum pentoxide.

The etch process may be stopped when the portions of the top electrode layer 207 and the dielectric layer 206 in the bottom electrode contact area 303 are removed, wherein at least one of a portion of the bottom electrode layer 205 in the bottom electrode contact area 303 and a portion of the bottom electrode layer 204 in the bottom electrode contact area 303 is not removed.

Thus, after the plasma etch process, at least one of the bottom electrode layer 204 and the bottom electrode layer 205 is exposed in the bottom electrode contact area 303.

In some embodiments, both a portion of the bottom electrode layer 204 and a portion of the bottom electrode layer 205 may remain on the semiconductor structure 100 in the bottom electrode contact area 303, so that the bottom electrode layer 205 is exposed in the bottom electrode contact area 303, as shown in FIGS. 4a and 4b. In the vicinity of the edge of the recess 201, a residue of the portion of the bottom electrode layer 204 at the sidewall of the recess that was not removed in the etch process may also be exposed, as shown in FIGS. 4a and 4b.

After the plasma etch process, a wet cleaning process may be performed for removing polymers, which may be formed during the plasma etch process, and residues of the materials of the bottom electrode layers 205, 205, for example aluminum residues, from the sidewalls of the recess 201. In some embodiments, in the wet cleaning process, the semiconductor structure 100 may be exposed to an amine-based resist stripper and/or tetramethyl ammonium hydroxide (TMAH).

In the capacitive area 302, portions of the bottom electrode layers 204, 205 form one electrode of the capacitor 401, and the portion of the top electrode layer 207 in the capacitive area 302 forms another electrode of the capacitor 401. The portion of the dielectric layer 206 in the capacitive area 302 provides a dielectric of the capacitor 401. Thus, the capacitor 401 can have a plate capacitor configuration.

The capacitive area 302 may have a substantially rectangular configuration, in particular a substantially square configuration, as shown in FIG. 4b, wherein corners of the capacitive area 302 may be rounded. As shown in FIG. 4b, the recess 201 may have a substantially rectangular configuration, wherein corners of the recess 201 may be rounded. In other embodiments, the recess 201 and the capacitive area 302 may have different shapes. For example, in some embodiments, the capacitive area 302 may have a circular shape, and the recess 201 may have an oval shape.

As described above, the formation of the capacitor 401 may include two photolithography processes, wherein a first photolithography process is performed for forming the recess 201, and a second photolithography process is performed for exposing at least one of the bottom electrode layers 204, 205 in the bottom electrode contact area 303. The first photolithography process is performed before the deposition of the capacitor layer stack 203, and the second photolithography process is performed after the chemical mechanical polishing process wherein portions of the capacitor layer stack 203 outside the recess 201 are removed. Hence, the first and the second photolithography process need not be performed in the presence of a contiguous capacitor layer stack 203 covering substantially the whole surface of the semiconductor structure 100. In particular, when the first and the second photolithography process are performed, alignment marks (not shown) in the semiconductor structure 100 need not be covered by the capacitor layer stack 203. Thus, in the first and the second photolithography process, conventional optical alignment techniques may be employed for aligning the masks 107, 301 to the semiconductor structure 100.

FIG. 5 shows a schematic cross-sectional view of the semiconductor structure 100 in a later stage of the manufacturing process. A layer 501 of an electrically insulating material may be formed. In some embodiments, the layers 106, 501 of electrically insulating material may be formed of the same material. In particular, both the layer 106 of electrically insulating material and the layer 501 of electrically insulating material may include silicon dioxide. Thus, the layers 106, 501 of electrically insulating material form an electrically insulating region enclosing the capacitor 401. The layer 501, when including silicon dioxide, may be formed by means of a chemical vapor deposition process or plasma enhanced chemical vapor deposition process, wherein tetraethylorthosilicate is used as a reactant, similar to the formation of the layer 106 of electrically insulating material described above.

After the deposition of the layer 501 of electrically insulating material, the layer 501 may have a non-planar surface topography. In particular, portions of the layer 501 of electrically insulating material over the bottom electrode contact area 303 may have substantially the same thickness as portions of the layer 501 of electrically insulating material over the capacitive area 302, so that the layer 501 of electrically insulating material has a recess 502 over the bottom electrode contact area 303.

Figure 6:
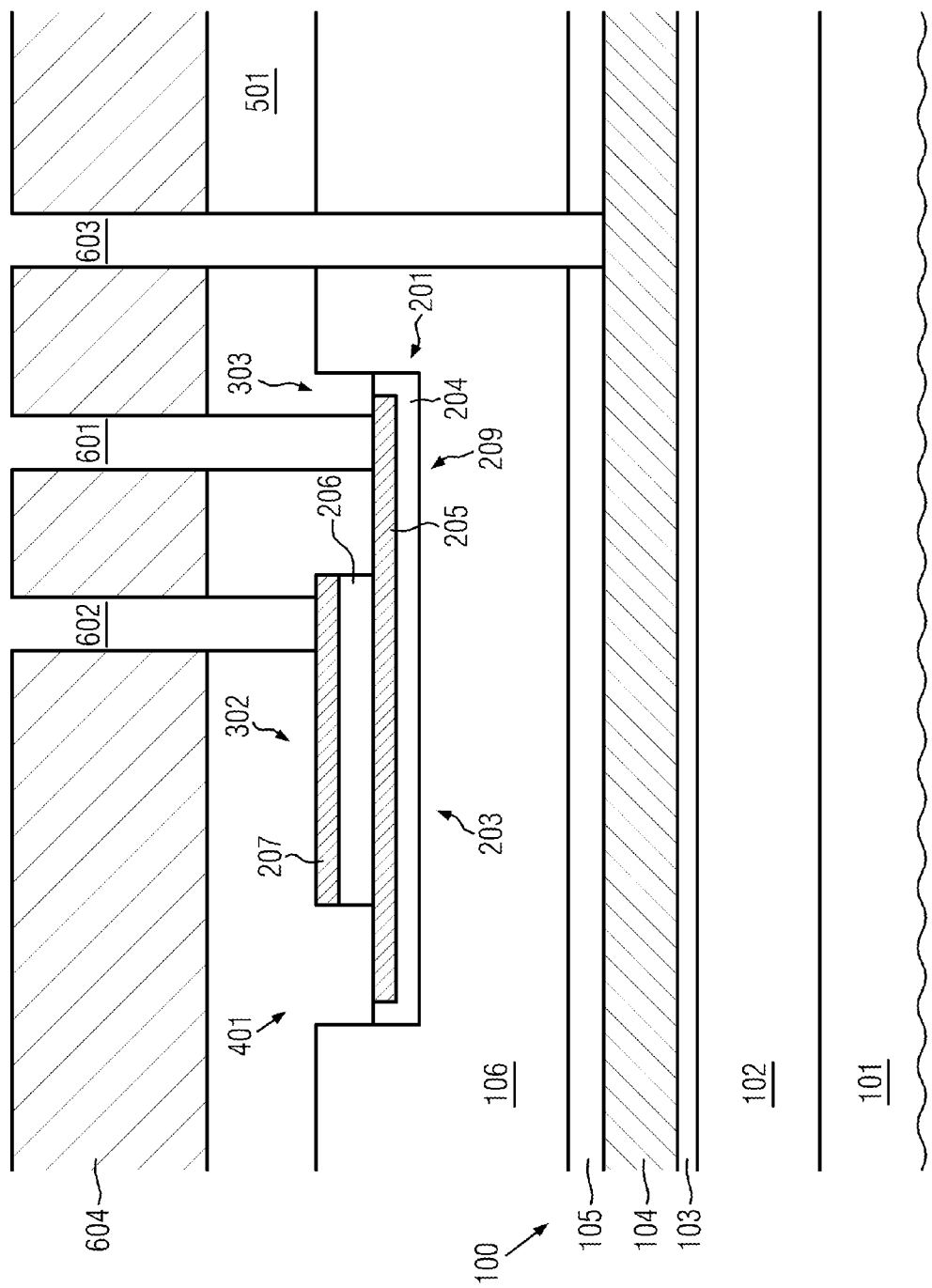
FIG. 6 shows a schematic cross-sectional view of the semiconductor structure in another stage of the manufacturing process.

FIG. 6 shows a schematic cross-sectional view of the semiconductor structure 100 in a later stage of the manufacturing process. After the deposition of the layer 501 of electrically insulating material, a planarization process may be performed. In some embodiments, the planarization process may be a chemical mechanical polishing process. After the planarization process, the layer 501 of electrically insulating material may have a substantially planar, horizontal surface that is perpendicular to the vertical direction of the semiconductor structure 100.

Thereafter, a bottom electrode contact via 601, a top electrode contact via 602 and a metal contact via 603 may be formed. This may be done by means of photolithography and etching processes. In the photolithography process, a mask 604 may be formed over the layer 501 of electrically insulating material. The mask 604 may include a photoresist. The mask 604 does not cover portions of the layer 501 of electrically insulating material at the locations of the contact vias 601, 602, 603. Other portions of the layer 501 of electrically insulating material may be covered by the mask 604.

After the formation of the mask 604, one or more etch processes, for example plasma dry etch processes, may be performed for forming the contact vias 601, 602, 603. The one or more etch processes may include an anisotropic etch process that is adapted to remove the materials of the layers 106, 501 of electrically insulating material. Due to the anisotropy of the etch process, substantially vertical sidewalls of the contact vias 601, 602, 603 may be obtained.

The anisotropic etch process may be a selective etch process adapted to selectively remove the material of the layers 106, 501 of electrically insulating material relative to the materials of the top electrode layer 207, the bottom electrode layer 205 and the etch stop layer 105. Thus, the etching of the materials of the layers 106, 501 of electrically insulating material stops as soon as the top electrode layer 207 is exposed at the bottom of the top electrode contact via 602, the bottom electrode layer 205 is exposed at the bottom of the contact via 601 and the etch stop layer 105 is exposed at the bottom of the metal contact via 603.

Thereafter, a further etch process may be performed for removing the portion of the etch stop layer 105 at the bottom of the metal contact via 603, so that the electrically conductive line 104 is exposed at the bottom of the metal contact via 603.

Figure 7:
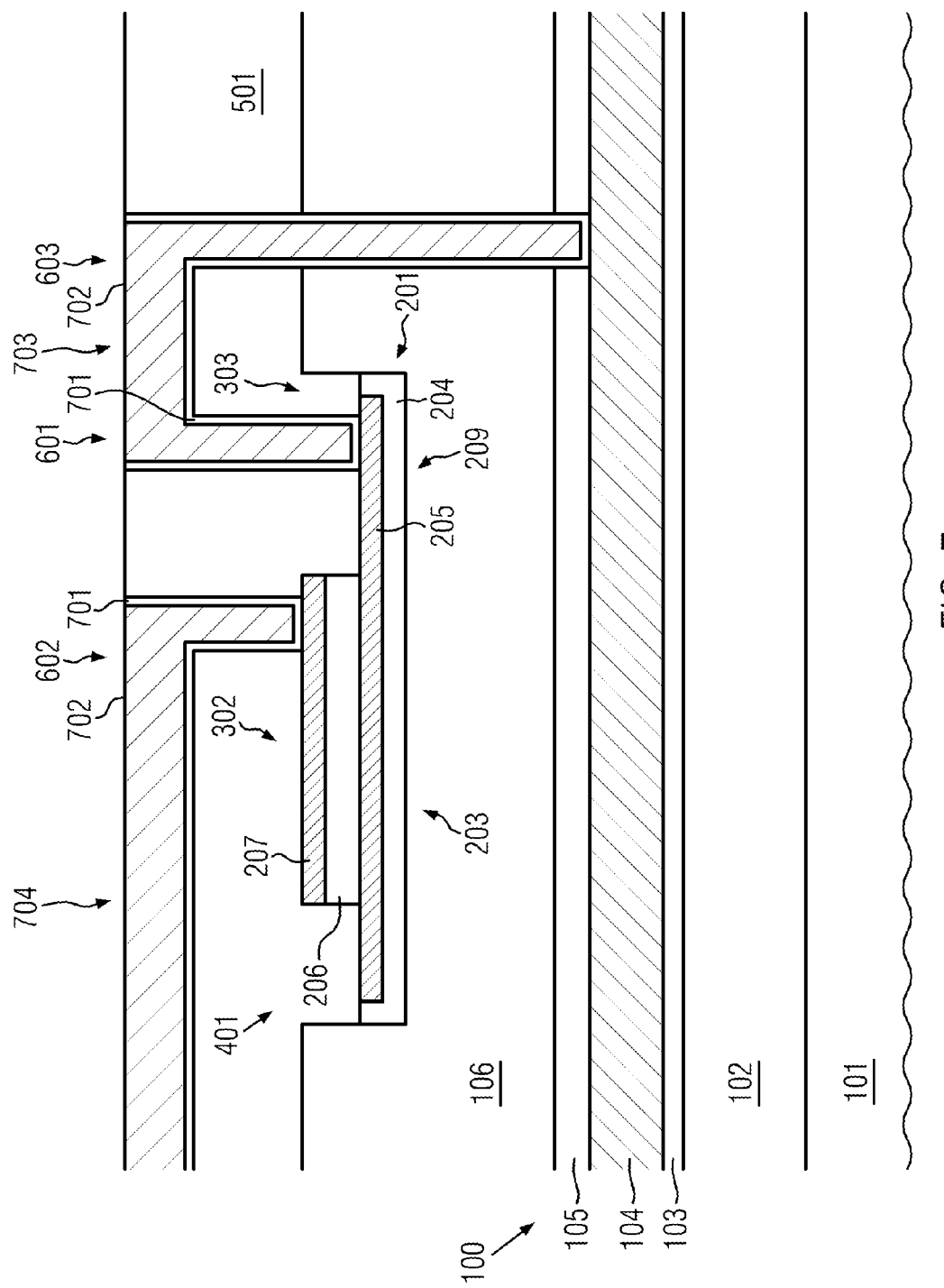
FIG. 7 shows a schematic cross-sectional view of the semiconductor structure in another stage of the manufacturing process.

FIG. 7 shows a schematic cross-sectional view of the semiconductor structure 100 in a later stage of the manufacturing process. After the formation of the contact vias 601, 602, 603, trenches 703, 704 may be formed in the layer 501 of electrically insulating material. Similar to the contact vias 601, 602, 603, the trenches 703, 704 may be formed by means of a photolithography process, wherein a mask (not shown) is formed over the semiconductor structure 100 that covers the surface of the layer 501 of electrically insulating material with the exception of those portions where the trenches 703, 704 are to be formed. Thereafter, an etch process adapted to remove the material of the layer 501 of electrically insulating material may be performed. Features of the etch process may correspond to those of the etch process used for removing the materials of the layers 106, 501 of electrically insulating material in the formation of the contact vias 601, 602, 603, wherein, however, a duration of the etch process may be shorter, in accordance with the depth of the trenches 703, 704. Thereafter, the mask used for forming the trenches 703, 704 may be removed by means of a resist strip process.

After the formation of the trenches 703, 704, a diffusion barrier layer 701 may be deposited over the semiconductor structure 100. Materials of the diffusion barrier layer 701 and methods for the formation thereof may correspond to those of the diffusion barrier layer 103 described above. After the formation of the diffusion barrier layer 701, the diffusion barrier layer 701 may cover surfaces at the bottom and the sidewalls of the contact vias 601, 602, 603 and the trenches 703, 704, as well as portions of the surface of the layer 501 of electrically insulating material adjacent the contact vias 601, 602, 603 and the trenches 703, 704.

A metal 702 may be deposited on the semiconductor structure 100. In some embodiments, the metal 702 may include copper and/or a copper alloy, and may be deposited by means of an electroplating process. The metal 702 may fill the contact vias 601, 602, 603 and the trenches 703, 704. After the deposition of the metal 702, metal may also be present over the surface of the layer 501 of electrically insulating material adjacent the contact vias 601, 602, 603 and the trenches 703, 704.

A chemical mechanical polishing process may be performed. In the chemical mechanical polishing process, portions of the diffusion barrier layer 701 and the metal 702 outside the contact vias 601, 602, 603 and the trenches 703, 704, in particular portions of the metal over surface portions of the layer 501 of electrically insulating material adjacent the contact vias 601, 602, 603 and the trenches 703, 704, may be removed, so that a configuration as shown in FIG. 7 is obtained.

The trench 703 filled with the metal 702 may provide an electrically conductive line providing an electrical connection between the bottom electrode contact via 601 and the metal contact via 603. The bottom electrode contact via 601 filled with the metal 702 may provide an electrical connection between the electrically conductive line in the trench 703 and the bottom electrode layers 204, 205. The metal contact via 603 may provide an electrical connection between the electrically conductive line formed in the trench 703 and the electrically conductive line 104. Thus, the bottom electrode layers 204, 205 of the capacitor 401 may be electrically connected to the electrically conductive line 104.

The metal 702 in the top electrode contact via 602 may provide an electrical connection between the top electrode layer 207 and the electrically conductive line formed by the metal 702 in the trench 704.

The electrically conductive line 104 and the electrically conductive line formed by the metal 702 in the trench 704 may provide an electrical connection between the capacitor 401 and other circuit elements (not shown) in the semiconductor structure 100.

Further processing steps may include a formation of one or more dielectric layers above the layer 501 of electrically insulating material and the metal 702.

The present disclosure is not limited to embodiments wherein the layer 501 of electrically insulating material is planarized by means of a chemical mechanical polishing process, as described above. In other embodiments, a different type of planarization process may be performed, as will be described with reference to FIG. 8 in the following. For convenience, in FIGS. 1-7, on the one hand, and in FIG. 8, on the other hand, like reference numerals have been used to denote like components. Components denoted by like reference numerals may have corresponding features, and corresponding methods may be used for their formation, unless explicitly stated otherwise.

Figure 8:
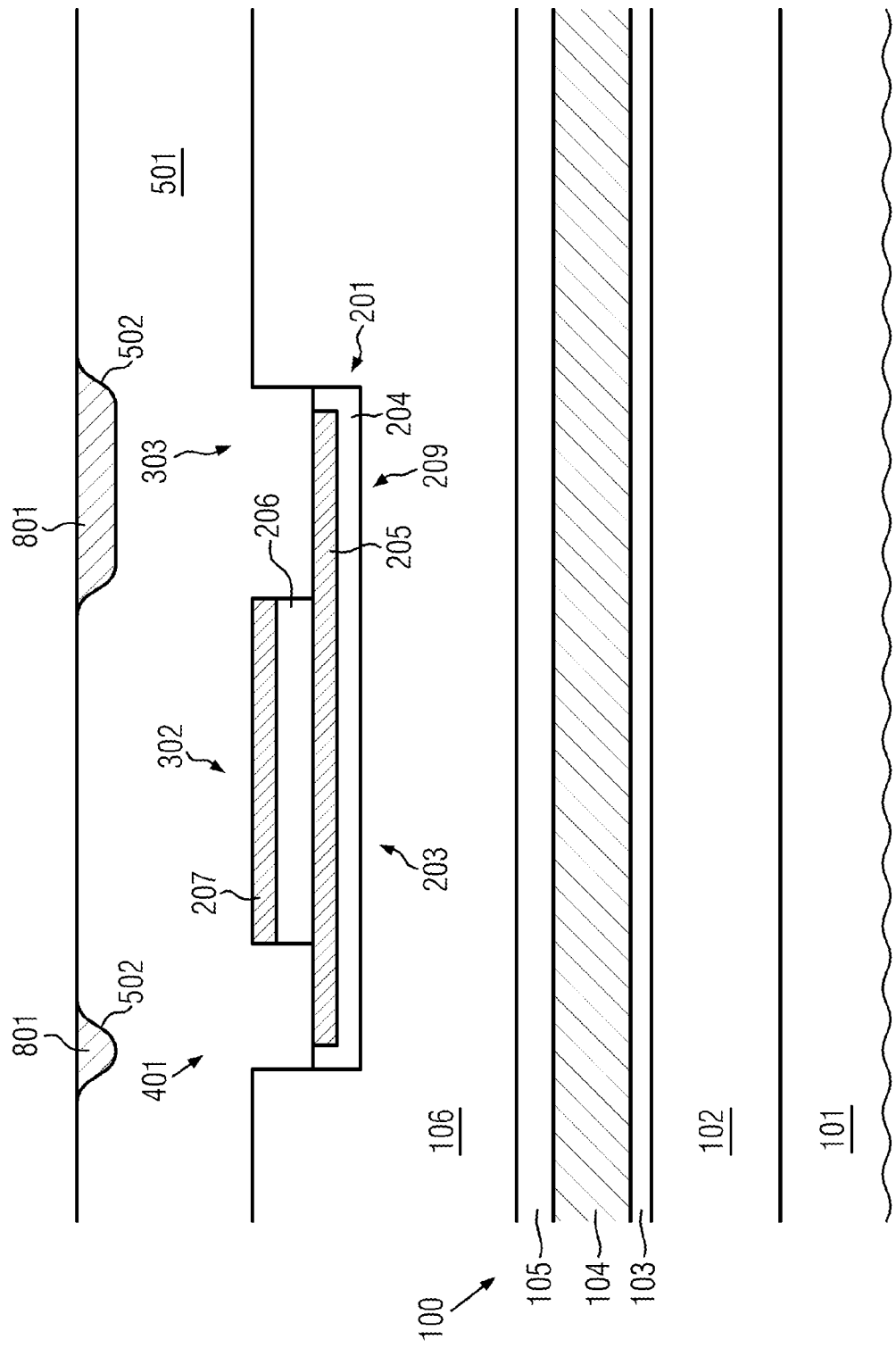
FIG. 8 shows a schematic cross-sectional view of the semiconductor structure in a stage of a manufacturing process according to an embodiment.

FIG. 8 shows a schematic cross-sectional view of the semiconductor structure 100 in a stage of the manufacturing process. The semiconductor structure 100 includes a substrate 101, an interlayer dielectric 102, an electrically conductive line 104 separated from other features of the semiconductor structure 100 by a diffusion barrier layer 103 and an etch stop layer 105, a layer 106 of an electrically insulating material having a recess 201 wherein a capacitor 401 is formed, and a layer 501 of electrically insulating material covering the capacitor 401. The capacitor 401 includes bottom electrode layers 204, 205, which are provided in a capacitive area 302 and a bottom electrode contact area 303. Additionally, the capacitor 401 includes a dielectric layer 206 and a top electrode layer 207 which are provided in the capacitive area 302. The layer 501 of electrically insulating material includes a recess 502 that is located above the bottom electrode contact area 303. The above-described features of the semiconductor structure 800 may be formed as described above with reference to FIGS. 1a-5.

After the deposition of the layer 501 of electrically insulating material, a planarization process may be performed. The planarization process may include a spin-on process. In the spin-on process, the semiconductor structure 100 may be rotated around an axis of rotation that is parallel to the vertical direction of the semiconductor structure 100. During the rotation of the semiconductor structure 100, a solution of a wet gap-fill material 801, which may include a known spin-on glass, for example a siloxane, a silicate and/or a hydrogen silsesquioxane in a solvent, may be supplied to the surface of the semiconductor structure 100.

Due to centrifugal forces, the solution of the wet gap-fill material 801 may be distributed over the surface of the semiconductor structure 100, and portions of the wet gap-fill material 801 on substantially horizontal surface portions of the layer 501 of electrically insulating material may be removed. However, portions of the wet gap-fill material 801 in the recess 502 of the layer 501 of electrically insulating material may remain on the semiconductor structure 100, and may fill the recess 502. Thus, a substantially planar surface of the semiconductor structure 100 may be obtained.

After the deposition of the wet gap-fill material 801, further processing steps as described above with reference to FIGS. 6-7 may be performed, wherein the chemical mechanical polishing of the layer 501 of electrically insulating material may be omitted.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first layer of an electrically insulating material over a semiconductor structure;
    forming a recess in said first layer of electrically insulating material;
    depositing a capacitor layer stack over said first layer of electrically insulating material, said capacitor layer stack comprising one or more bottom electrode layers, a dielectric layer and a top electrode layer, wherein a first portion of said capacitor layer stack is arranged in said recess and a second portion of said capacitor layer stack is arranged over a portion of said first layer of electrically insulating material adjacent said recess; and
    performing a chemical mechanical polishing process, said chemical mechanical polishing process removing said second portion of said capacitor layer stack, wherein at least a substantial part of said first portion of said capacitor layer stack is not removed.

2. The method of claim 1, wherein at least one of said one or more bottom electrode layers comprises at least one of a metal and a metal compound, and said top electrode layer comprises at least one of a metal and a metal compound.

3. The method of claim 1, further comprising, after said chemical mechanical polishing process, forming a capacitor from said first portion of said capacitor layer stack, said capacitor comprising a capacitive area and a bottom electrode contact area adjacent said capacitive area, the formation of said capacitor comprising removing a portion of said top electrode layer and a portion of said dielectric layer in said bottom electrode contact area so that one of said one or more bottom electrode layers is exposed in said bottom electrode contact area, wherein portions of said top electrode layer and said dielectric layer in said capacitive area are not removed.

4. The method of claim 3, wherein the formation of said capacitor comprises:
    forming a mask covering the capacitive area and at least the portion of said first layer of electrically insulating material adjacent said recess, wherein said mask does not cover said bottom electrode contact area; and
    performing an etch process, said etch process removing the portions of said top electrode layer and said dielectric layer in said bottom electrode contact area.

5. The method of claim 3, further comprising forming a second layer of an electrically insulating material over said semiconductor structure, said second layer of electrically insulating material covering said capacitor.

6. The method of claim 5, further comprising forming a bottom electrode contact via and a top electrode contact via in said second layer of electrically insulating material, said bottom electrode contact via being arranged over said bottom electrode contact area, said top electrode contact via being arranged over said capacitive area.

7. The method of claim 6, further comprising planarizing said second layer of electrically insulating material before the formation of said bottom electrode contact via and said top electrode contact via.

8. The method of claim 7, wherein said planarization comprises performing a chemical mechanical polishing process.

9. The method of claim 7, wherein said planarization comprises performing a spin-on process depositing a wet gap fill material on said first layer of semiconductor material.

10. The method of claim 6, further comprising filling said top electrode contact via and said bottom electrode contact via with an electrically conductive material.

11. The method of claim 10, wherein said semiconductor structure comprises an electrically conductive feature comprising a metal.

12. The method of claim 11, further comprising forming a metal contact via in said first layer of electrically insulating material and said second layer of electrically insulating material, said metal contact via being located over said electrically conductive feature.

13. The method of claim 11, wherein said recess in said first layer of electrically insulating material is formed over said electrically conductive feature.

14. The method of claim 13, wherein said electrically conductive feature comprises an electrically conductive line.

15. The method of claim 1, wherein said one or more bottom electrode layers comprise a first bottom electrode layer comprising aluminum and a second bottom electrode layer comprising titanium nitride.

16. The method of claim 15, wherein said dielectric layer comprises tantalum pentoxide.

17. The method of claim 16, wherein said top electrode layer comprises titanium nitride.

18. The method of claim 1, wherein a thickness of said capacitor layer stack and a depth of said recess are approximately equal.

19. The method of claim 1, wherein the formation of said recess comprises forming a mask over said first layer of electrically insulating material and performing an etch process partially removing portions of said layer of electrically insulating material that are not covered by said mask.

20. A method, comprising:
    forming a layer of an electrically insulating material over a semiconductor structure, said semiconductor structure comprising an electrically conductive line comprising a metal;
    forming a recess in said layer of electrically insulating material;

depositing a capacitor layer stack over said layer of electrically insulating material, said capacitor layer stack comprising one or more bottom electrode layers comprising at least one of a metal and a metal compound, a dielectric layer and a top electrode layer comprising at least one of a metal and a metal compound, wherein said capacitor layer stack has a thickness corresponding to a depth of said recess;

performing a chemical mechanical polishing process, said chemical mechanical polishing process removing a first portion of said capacitor layer stack over a portion of said layer of electrically insulating material adjacent said recess, wherein at least a substantial part of a second portion of said capacitor layer stack in said recess is not removed; and after the chemical mechanical polishing process, performing a photolithography process, said photolithography process patterning said second portion of said capacitor layer stack.

* * * * *